United States Patent
Liu et al.

(10) Patent No.: US 9,508,877 B2
(45) Date of Patent: Nov. 29, 2016

(54) METHOD FOR MANUFACTURING A FRONT ELECTRODE OF A SEMICONDUCTOR DEVICE

(71) Applicants: Xiaoli Liu, ShenZhen (CN); Delin Li, San Jose, CA (US)

(72) Inventors: Xiaoli Liu, ShenZhen (CN); Delin Li, San Jose, CA (US)

(73) Assignee: Soltrium Advanced Materials Technology, ShenZhen (CN)

( * ) Notice: Subject to any disclaimer, the term of this patent is extended or adjusted under 35 U.S.C. 154(b) by 0 days.

(21) Appl. No.: 15/155,199

(22) Filed: May 16, 2016

(65) Prior Publication Data
US 2016/0260851 A1  Sep. 8, 2016

Related U.S. Application Data

(62) Division of application No. 13/894,908, filed on Jun. 21, 2013, now abandoned.

(51) Int. Cl.
| | |
|---|---|
| H01L 21/00 | (2006.01) |
| H01L 31/0224 | (2006.01) |
| H01L 31/0216 | (2014.01) |
| H01L 31/028 | (2006.01) |
| H01L 31/068 | (2012.01) |
| H01L 31/18 | (2006.01) |

(52) U.S. Cl.
CPC ..... *H01L 31/022425* (2013.01); *H01L 31/028* (2013.01); *H01L 31/02168* (2013.01); *H01L 31/068* (2013.01); *H01L 31/1804* (2013.01); *H01L 31/1864* (2013.01)

(58) Field of Classification Search
USPC ............ 252/512–514; 438/98, 660; 136/256; 429/523
See application file for complete search history.

(56) References Cited

U.S. PATENT DOCUMENTS

| | | | | |
|---|---|---|---|---|
| 3,282,737 | A  * | 11/1966 | Hintermann | C23C 18/16 106/1.12 |
| 8,257,617 | B2 * | 9/2012 | Klein | C09K 13/08 252/512 |
| 8,497,420 | B2 * | 7/2013 | Carroll | B22F 1/0059 136/256 |
| 9,023,253 | B2 * | 5/2015 | Liu | H01L 31/022425 136/256 |
| 2011/0232747 | A1 * | 9/2011 | Mikeska | B22F 1/0059 136/256 |
| 2011/0308595 | A1 * | 12/2011 | Carroll | B22F 1/0059 136/256 |
| 2014/0220732 | A1 * | 8/2014 | Liu | H01L 31/022425 438/98 |
| 2015/0162481 | A1 * | 6/2015 | Liu | H01L 31/022425 438/98 |

* cited by examiner

Primary Examiner — Telly Green
(74) *Attorney, Agent, or Firm* — Fang Wu (57) ABSTRACT

The present invention provides a method for manufacturing a front electrode of a semiconductor device. The method includes using an electrically conductive paste composed of a glass-free corrosion binder, a metallic powder and an organic carrier. The corrosion binder is one or more Pb—Te based crystalline compounds having a fixed melting temperature in a range of 440° C. to 760° C. During a sintering process of the electrically conductive paste for forming an electrode, the glass-free corrosion binder is converted into a liquid for easily corroding and penetrating an antireflective insulating layer on a front side of the solar cell, so that a good ohmic contact is formed. At the same time, the electrically conductive metallic powder is wetted, and the combination of the metallic powder is promoted. As a result, a high-conductivity front electrode of a crystalline silicon solar cell is formed.

6 Claims, 7 Drawing Sheets

METHOD FOR MANUFACTURING A FRONT ELECTRODE OF A SEMICONDUCTOR DEVICE

CROSS-REFERENCES TO RELATED APPLICATIONS

This application is a divisional application of U.S. patent application Ser. No. 13/894,908 filed on Jun. 21, 2013 and claims priority to a PCT Application No. PCT/CN2013/073098, filed on Mar. 22, 2013, commonly assigned and incorporated as reference for all purposes.

The subject matter of the present application is related to China Patent Application No. 201210360864.5, filed on Sep. 25, 2012, by Ran Guo, U.S. patent application Ser. No. 13/730,939, filed on Dec. 28, 2012, by Ran Guo, and U.S. patent application Ser. No. 13/787,997, filed on Mar. 7, 2013, by Xiaoli Liu et al., commonly assigned and incorporated by reference herein to their entireties for all purposes.

BACKGROUND OF THE INVENTION

The present invention relates to the technical field of solar cells, and more particularly to an electrically conductive paste for a front electrode of a solar cell and a preparation method thereof.

Solar energy is an inexhaustible source of clean energy. With the increasing depletion of coal, oil and other non-renewable energy, development and use of solar energy have become a big trend. Use of solar cells is a typical means of using solar energy, and crystalline silicon solar cells for which industrial production has been achieved are one type of solar cells.

As the most important core part of crystalline silicon solar cells, a cell sheet needs to collect and export a current generated under light irradiation, so two electrodes need to be fabricated on a front side and a back side of the cell sheet. Many methods can be used to fabricate the electrodes, among which screen printing and co-sintering are the most commonly used production processes currently.

In a crystalline silicon solar cell, an electrically conductive paste for a front electrode, an electrically conductive paste for a back electrode, and a paste for an aluminum back-surface field are coated on a silicon chip by adopting screen printing, and a front electrode is formed on the front side of the silicon chip through co-sintering.

The co-sintered electrode of a crystalline silicon solar cell is required to have strong adhesion, have no ash falling and no deformation of the silicon chip, and be easy to weld and convenient to collect and export the current generated under light irradiation by means of a wire. Compared with the electrically conductive paste for a back electrode of the silicon solar cell, the electrically conductive paste for a front electrode of a silicon solar cell is required to have the ability to penetrate the silicon nitride antireflective layer.

In the prior art, the electrically conductive paste for the front electrode of a crystalline silicon solar cell is composed of a silver powder, a glass frit, an additive and an organic carrier. The glass frit, as an inorganic adhesive, binds the high-conductivity silver powder and the silicon substrate together, and during co-sintering, the molten glass frit etches and penetrates the silicon nitride antireflective layer, so that a good contact is formed between the silver powder and the silicon substrate. Generally, the glass frit in the paste has the following effects: (1) wetting the metallic powder to promote the sintering of the metallic powder; and (2) etching the antireflective layer to promote the contact of the metal and the silicon surface and ensure the binding effect between the metal and the silicon surface. In order to achieve a good ohmic contact of the metallic powder and the silicon surface, the antireflective layer is required to be etched through but not penetrate into a P—N junction region. In the selection of the glass frit, the composition, softening point, thermal expansion coefficient, wetting properties and amount will affect the physical and chemical changes in the sintering process, thereby affecting the performance of the solar cell. In the sintering process, the glass frit is gradually softened, and within a short process cycle, usually 1 to 2 minutes, part of the softened glass frit remains around the metallic powder and flows, and the other part of the softened glass frit flows to reach the antireflective layer at the bottom and induces a reaction. If the content of the glass frit is low, full contact and complete reaction of the glass frit and the antireflective layer cannot be ensured. If it is ensured that the antireflective layer is completely penetrated, a sufficient amount of the glass frit needs to be added. The higher the amount of the glass frit is, the lower the relative content of the electrically conductive metallic phase is, and the lower the probability of contact of metallic particles is, resulting in serious deterioration of conductivity. If a glass frit with a low softening point such as a softening point of lower than 400° C. is selected to ensure that a sufficient amount of glass frit is deposited on the surface of the antireflective layer in the entire process, and react with the antireflective layer completely. But excessively-early softening of the glass frit can clog the communicating pores in the metallic powder, thereby hindering the effective discharge of the organic carrier.

Presently, a Pb—Si based glass material is widely used as the glass frit in the front electrode paste. At the same time, Pb oxide, Te oxide and other oxides or fluorides are used to go through a series of processes of melting, mixing and quenching, to prepare a Pb—Te—O glass material. However, regardless the use of various glass frit materials, due to restrictions of the physical properties of the glass frit, the above technical problems still exist, resulting in process difficulties with narrow windows in preparation of a suitable glass frit and a subsequent conductive paste. Therefore, improved techniques are desired for the manufacture of an electrically conductive paste for forming front electrodes of semiconductor devices.

BRIEF SUMMARY OF THE INVENTION

The objective of the present invention is to improve an electrically conductive paste for the manufacture of an electrode on a semiconductor surface. The electrically conductive paste is characterized by a strong adhesion property by adding a full-crystal-based corrosion binder free of any glass frit for facilitating a formation of an electrode with excellent metal-semiconductor electrical contact. In particular, the electrically conductive paste can be applied for forming a front electrode of a silicon-based solar cell with overall enhanced light conversion efficiency. An alternative objective of the present invention is to provide a method of making the electrically conductive paste free-from any glass frit in additives using a simple process with easy-controlled conditions and reduced production cost.

In a specific embodiment, the present invention provides an electrically conductive paste for a front electrode of a solar cell. The electrically conductive paste includes a metallic powder having a weight ratio of 70 wt % to 95 wt % based on a given total weight. Additionally, the electrically conductive paste includes a glass-free corrosion binder having a weight ratio of 0.5 wt % to 12 wt % based on the given total weight. Moreover, the electrically conductive paste includes an organic carrier having a weight ratio of 5 wt % to 25 wt % based on the given total weight. The glass-free corrosion binder is a Pb—Te—O crystal compound having a fixed melting temperature between 440° C. and 760° C. The metallic powder and the glass-free corrosion binder are randomly dispersed in the organic carrier.

In another specific embodiment, the present invention provides a method for forming a conductive paste. The method includes providing a plurality of metal particles with a weight composition ranging from 70 wt % to 95 wt % based on a predetermined total weight. The method further includes providing an organic carrier with a weight composition ranging from 5 wt % to 25 wt % based on the predetermined total weight. Additionally, the method includes providing a glass-free corrosion binder made from a plurality of Pb—Te—O-based crystalline particles with a weight composition ranging from 0.5 to 12 wt % based on the predetermined total weight. The method further includes mixing the plurality of metal particles, the glass-free corrosion binder, and the organic carrier to form a mixture material. Furthermore, the method includes grinding the mixture materials to obtain a conductive paste.

In an alternative embodiment, the present invention provides methods for making the electrically conductive paste, which is to mix the metallic powder, glass-free corrosion binder, and organic carrier followed by grinding so that the metallic powder and the glass-free corrosion binder are uniformly randomly dispersed in the organic carrier. The glass-free corrosion binder of the present invention is a glass-free Pb—Te—O based crystalline compound, which is made by using one of the following methods: chemical reaction method, chemical vapor phase method, high-temperature melting reaction method, wet method and vacuum melting method. The glass-free corrosion binder of the present invention includes one or a combination of two or more selected from the following glass-free Pb—Te—O based crystalline compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_2O_5$, $PbH_4TeO_6$, $PbTeCO_5$ and $Pb_3TeN_2O_8$. The glass-free corrosion binder is a power with particles at least in one shape selected from sphere, droplet, aciculate, dendritic-shape, massive, spherical-shape, flake, granular-shape, and colloidal-particle-shape. The particles have sizes in a range of 0.1 to 5.0 μm in most applications, but has sizes in a range of 0.1 to 15.0 μm in some applications.

In another alternative embodiment, the present invention provides a method for manufacturing a front electrode of a semiconductor device. The method includes providing a semiconductor device including an insulation surface coating and printing an electrically conductive paste overlying a patterned contact region of the insulation surface coating. The electrically conductive paste includes a metallic powder with a weight composition ranging from 70 to 95 wt % based on a given total weight of the electrically conductive paste, a glass-free corrosion binder made from a plurality of Pb—Te—O-based crystalline particles with a weight composition ranging from 0.5 to 12 wt % based on the given total weight, and an organic carrier with a weight composition ranging from 4.5 to 25 wt % based on the given total weight. The glass-free corrosion binder is one or a combination of two or more Pb—Te—O based crystalline compounds, having a fixed melting temperature in a range of 440° C. to 760° C. The method further includes sintering the electrically conductive paste overlying the patterned contact region of the insulation surface coating. The sintering process includes a step of drying the electrically conductive paste at a first temperature range from 180° C. to 260° C. for 30 s up to 70 s. The sintering process further includes a step of heating up to a second temperature range from 720° C. to 950° C. for 20 s up to 50 s and a step of cooling back to 25° C. to form an electrode. The drying and heating from the first temperature range to the second temperature range are associated with releasing of the organic carrier, melting of the glass-free corrosion binder at the fixed melting temperature after the releasing of the organic carrier, and forming of a metallic bulk from the metallic powder wet by molten glass-free corrosion binder. The molten glass-free corrosion binder induces etch-removing of the insulation surface coating at the patterned contact region to form an ohmic contact between the metallic bulk and the crystalline silicon solar cell.

The electrically conductive paste used for the manufacture of front side electrodes on solar cell light receiving surface comprises full-crystal corrosion binder and free from any glass material as a binding additive in the paste. By controlling proper metal-oxide materials with selective weight ratio among several ingredients and crystal particle sizes during the preparation of the full-crystal glass-free corrosion binder, and further by controlling the way of mixing with metallic powder and organic carrier, the conductive paste bearing this full-crystal glass-free corrosion binder can be subjected to a broader range of sintering process conditions to form electrodes on solar cells with greatly reduced series resistance and enhanced photovoltaic conversion efficiency.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION OF THE INVENTION

The present invention provides an electrically conductive paste for a front electrode of a solar cell and a preparation method thereof, and a method for preparing a front electrode of a crystalline silicon solar cell by using the electrically conductive paste.

The electrically conductive paste for a front electrode of a solar cell according to the present invention includes the following components:
- a metallic powder, having a weight ratio of 70 wt % to 95 wt % in the electrically conductive paste for a front electrode of a solar cell;
- a glass-free corrosion binder, having a weight ratio of 0.5 wt % to 12 wt % in the electrically conductive paste for a front electrode of a solar cell; and
- an organic carrier, having a weight ratio of 5 wt % to 25 wt % in the electrically conductive paste for a front electrode of a solar cell.

The glass-free corrosion binder is a Pb—Te—O based crystalline compound having a melting temperature in a range of 440° C. to 760° C.; and the metallic powder and the glass-free corrosion binder are randomly dispersed in the organic carrier. The glass-free corrosion binder of the present invention includes one or a combination of two or more selected from the following Pb—Te—O based crystalline compounds: $PbTe_4O_9$, $PbTeO_3 \cdot 0.33H_2O$, $PbTeO_3$, $PbTeO_4$, $PbTe_3O_7$, $PbTe_5O_{ii}$, $Pb_2TeO_4$, $Pb_2Te_3O_7$, $Pb_2Te_3O_8$, $Pb_3TeO_5$, $Pb_3TeO_6$, $Pb_3Te_2O_8 \cdot H_2O$, $Pb_4Te_{1.5}O_7$, $Pb_5TeO_7$, $Pb_5TeO_7$, $Pb_6Te_5O_{18} \cdot 5H_2O$, $PbTe_2O_5$, $PbH_4TeO_6$, $PbTeCO_5$ and $Pb_3TeN_2O_8$.

Furthermore, a method for preparing the glass-free corrosion binder includes: mixing a hot telluric acid solution (tellurous acid solution, tellurate solution or tellurite solution) and a lead acetate solution, where the molar ratio of Te to Pb in the solution is in a range of 0.1:10 to 10:0.1; stirring the mixed solution at a temperature in a range of 80° C. to 120° C. at a stirring speed in a range of 1,000 to 1,500 r/min for reaction for 2 to 5 hours, to generate a precipitate, and collecting a solid through solid-liquid separation and washing, till the pH value of the filtrated water is in a range of 5 to 7, and drying the solid at 150° C. for 2 to 3 hours, to obtain the Pb—Te based crystalline compound, which is then pulverized and ground, to obtain a Pb—Te based crystalline compound particle.

Furthermore, a method for preparing the glass-free corrosion binder includes: continuously introducing $Pb_xTe_y$ alloy vapor into a reaction chamber filled with oxygen atmosphere; reacting at a temperature in a range of 1,000° C. to 1,400° C. for 1 to 4 hours, and naturally cooling the resulting product to 25° C. to obtain the Pb—Te—O based crystalline compound, which is then pulverized and ground, to obtain a Pb—Te—O based crystalline compound particle.

Furthermore, a method for preparing the glass-free corrosion binder includes: in a non-reducing atmosphere (including oxygen atmosphere, air atmosphere, nitrogen atmosphere, and argon gas atmosphere), heating a tellurium oxide and a lead oxide to a temperature in a range of 700° C. to 1,000° C., melting the tellurium oxide and the lead oxide for reaction, naturally cooling the resulting product to 25° C., and then pulverizing and grinding, to obtain a Pb—Te—O based crystalline compound particle.

Furthermore, a method for preparing the glass-free corrosion binder includes: in a vacuum atmosphere, melting a tellurium oxide and a lead oxide at a temperature in a range of 700° C. to 1,000° C., naturally cooling the resulting product to 25° C., and then pulverizing and grinding, to obtain a Pb—Te—O based crystalline compound particle.

Figure 1:
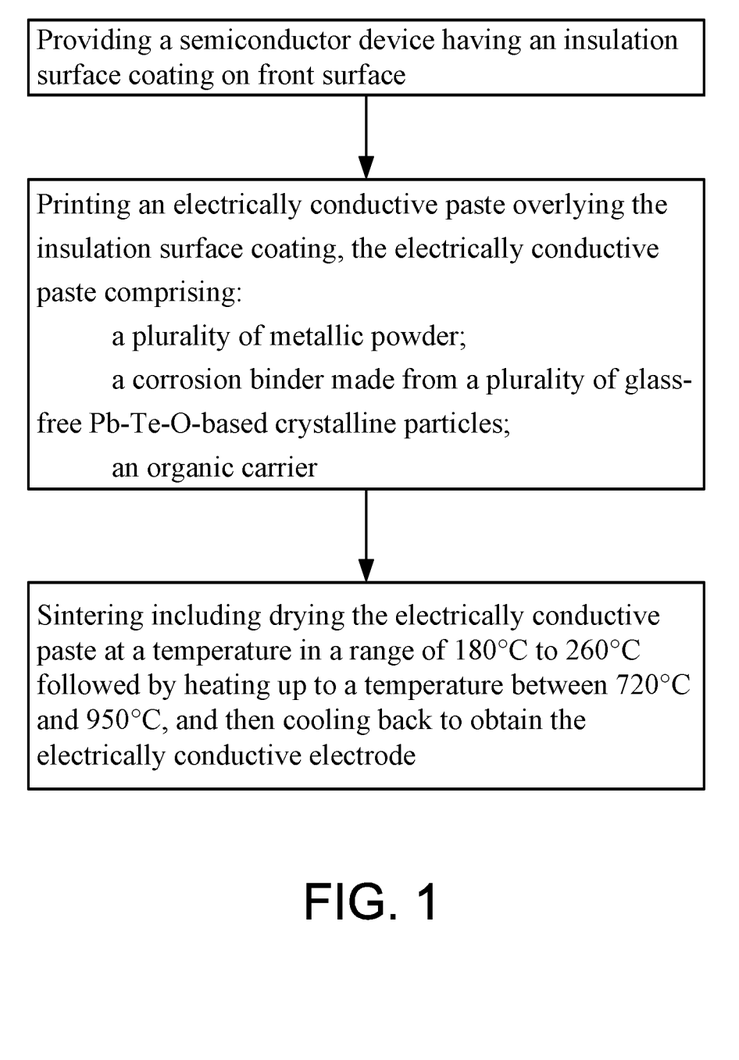
FIG. 1 is a schematic view of a process of preparing a front electrode by using an electrically conductive paste of the present invention.

FIG. 1 is a schematic view of a process of preparing a front electrode of a crystalline silicon solar cell by using an electrically conductive paste of the present invention. The method for preparing a front electrode of a high-performance crystalline silicon solar cell according to the present invention includes providing a crystalline silicon semiconductor device having an insulating film on an upper surface. The insulating film is an overlaying layer of one or a combination of two or more selected from silicon nitride, titanium oxide, aluminum oxide and silicon oxide. The method further includes printing an electrically conductive paste for a front electrode of a solar cell on the insulating film of the crystalline silicon semiconductor device. The electrically conductive paste for a front electrode of a solar cell contains formulation components of the following parts by weight, based on the total weight of 100 parts: 1) a metallic powder 70 to 95 parts; 2) an organic carrier 5 to 25 parts; and 3) a sum of a glass-free corrosion binder and a glass frit 0.5 to 12 parts. The glass-free corrosion binder is one or a combination of two or more Pb—Te—O based crystalline compounds, having a melting temperature in a range of 440° C. to 760° C. and a particle size in a range of 0.1 to 15.0 Additionally, the method includes sintering. The sintering process includes: first, drying the electrically conductive paste printed on the insulating film of the crystalline silicon semiconductor device at a temperature in a range of 180° C. to 260° C.; next, sintering by heating to 720° C. to 950° C.; and then cooling to obtain the electrically conductive electrode. In the process of sintering the electrically conductive paste for an electrode, the organic carrier is removed through evaporation and the glass-free corrosion binder is converted into a liquid and easily flows, corrodes, and penetrates an antireflective insulating layer on a front side of a crystalline silicon solar cell, and wets the electrically conductive metallic powder, thereby promoting the combination of the metallic powder. As a result, a good ohmic contact is formed between the electrically conductive metallic powder and the crystalline silicon solar cell, and a high-conductivity front electrode of a crystalline silicon solar cell is formed.

Figure 2:
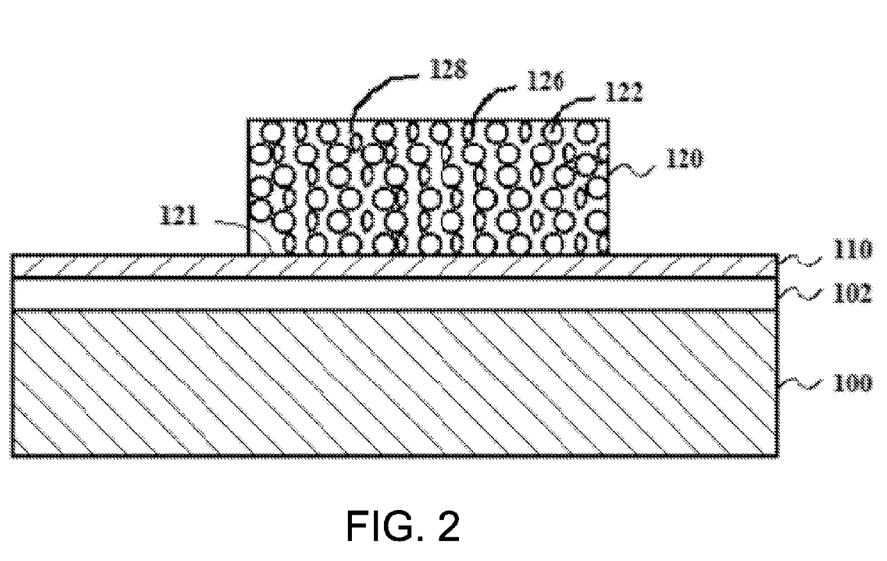
FIG. 2 is a partial structural view of a crystalline silicon solar cell printed with an electrically conductive paste before sintering.

FIG. 2 is a partial structural view of a crystalline silicon solar cell printed with an electrically conductive paste before sintering. It should be noted that FIG. 2 only shows an example, which should not be used to limit the scope of the present invention. As shown in FIG. 2, the crystalline silicon solar cell is composed of a semiconductor substrate 100, an emitter 102 and an insulating layer 110, a P—N junction region exists between the semiconductor substrate 100 and the emitter 102, the electrically conductive paste 120 for an electrode is selectively printed on a partial surface of the insulating layer 110 by adopting screen printing. The electrically conductive paste for an electrode includes a metallic powder 122, a glass-free corrosion binder 126 and an organic carrier 128. According to the design and application of a solar cell, the printing width of the electrically conductive paste 120 for an electrode may be in a range of 20 μm to 3 mm, and the printing width of a thin electrode may be in a range of 20 to 70 μm, and the printing width of the main electrode may be in a range of 1 to 3 mm.

Figure 3:
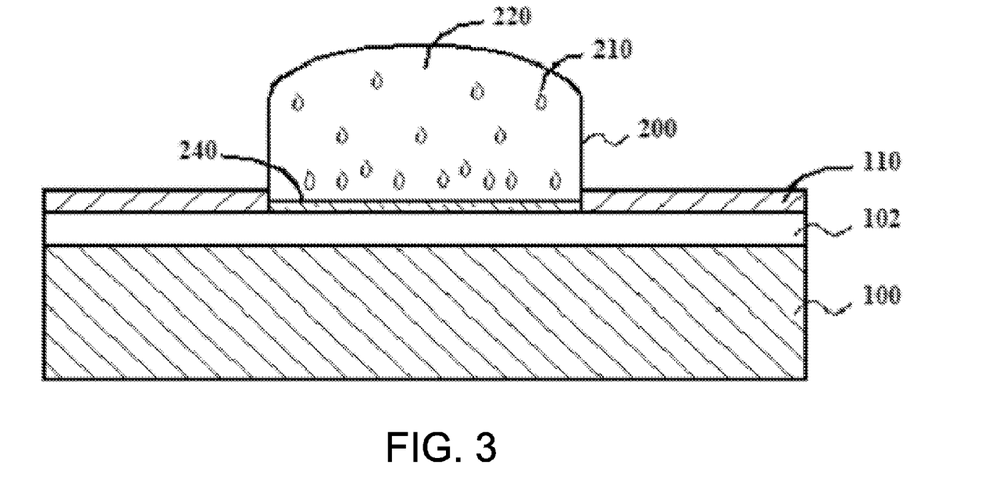
FIG. 3 is a partial structural view of a crystalline silicon solar cell after an electrically conductive paste is sintered.

FIG. 3 is a partial structural view of a crystalline silicon solar cell after an electrically conductive paste is sintered. It should be noted that FIG. 3 only shows an example, which should not be used to limit the scope of the present invention. As shown in FIG. 3, after sintering, the electrically conductive paste is converted into an electrode 200. The sintering process includes drying the electrically conductive paste by heating from 25° C. to a temperature in a range of 180° C. to 260° C., and then heating to a temperature in a range of 720° C. to 950° C. for sintering, and cooling, to form the electrode 200. In the sintering process, with the raise of the temperature, the organic carrier in the electrically conductive paste is removed, and the glass-free corrosion binder is melted into a liquid 210 and flows towards a surface of the insulating layer 110, etches and penetrates the insulating film 110 on a surface of the crystalline silicon semiconductor device, so that the metallic powder directly contacts the substrate of the crystalline silicon semiconductor device, and an ohmic layer 240 is formed. The molten glass-free corrosion binder promotes the combination of the metallic powder, and a high-conductivity metallic powder combination 220 is formed, which has a good ohmic contact with the semiconductor 102 through the ohmic layer 240. As a result, a high-conductivity front electrode 200 of a crystalline silicon solar cell is formed. In an embodiment, the front electrode of the present invention includes a metallic powder uncoated with silver, which includes one or a combination of two or more selected from silver, gold, platinum, copper, iron, nickel, zinc, titanium, cobalt, chromium, aluminum, manganese, palladium and rhodium. In another embodiment, the front electrode of the present invention includes one or a combination of two or more selected from copper, iron, nickel, aluminum, zinc, titanium, cobalt, chromium and manganese coated with silver. In another embodiment, the front electrode of the present invention includes a mixture of a metallic powder uncoated with silver and a metallic powder coated with silver, and the weight ratio of the metallic powder uncoated with silver to the metallic powder coated with silver is 5:95 to 95:5.

The components, the preparation method and the use of the electrically conductive paste for a front electrode of a crystalline silicon solar cell according to the present invention are described in detail below.

I. Glass-Free Corrosion Binder

Conventional electrically conductive paste for a front electrode of a crystalline silicon solar cell composes a silver powder, a glass frit, an additive and an organic carrier. The electrically conductive paste is generally printed on a front side or a light irradiation side of the crystalline silicon solar cell, and then is sintered to form a front electrode. In the sintering process, the glass frit in the electrically conductive paste etches and penetrates an antireflective insulating layer on the front side or the light irradiation side of the crystalline silicon solar cell, so that the silver powder contacts the substrate of the crystalline silicon solar cell to form a front electrode, where the antireflective insulating layer is made of, for example, silicon nitride, titanium oxide, aluminum oxide and silicon oxide or silicon oxide/titanium oxide. The glass frit used in the conventional electrically conductive paste for a front electrode of a crystalline silicon solar cell is an amorphous structure material. In a heating process, the glass frit gets soft first, which is referred to as a softening temperature. The different types of glass frits have different softening temperature. Atoms in the glass frit are arranged disorderly, and X-ray diffraction (XRD) measurement shows that a bump with wide distribution and low intensity exists and no sharp diffraction characteristic peaks exist, which is different from the situation of a crystalline compound.

The glass frit is generally prepared by heating oxide material or materials to a melting state followed by quenching the molten. For example, US Patent No. US2011/0308595 discloses an electrically conductive paste for a front electrode of a crystalline silicon solar cell, in which a glass frit is made from a lead tellurium oxide (Pb—Te—O) material, the method for preparing of the glass frit includes: mixing a lead oxide and a tellurium oxide, heating the mixture to a molten state in an air atmosphere or oxygen atmosphere; then, quenching the molten mixture, and grinding, to obtain the led tellurium oxide (Pb—Te—O)-based glass frit. In another example, PCT Patent No. WO2012/129554 discloses an electrically conductive paste for a front electrode of a crystalline silicon solar cell, in which a Pb—Te—O-based glass frit is used. A method for preparing the glass frit is a conventional glass preparation method, and includes: mixing a lead oxide and a tellurium oxide, heating the mixture to a molten state; then quenching the molten mixture, and grinding, to obtain the Pb—Te—O-based glass frit. In another example, PCT Patent No. WO2012/129554 discloses that atoms in glass frit are arranged disorderly, and XRD measurement shows that a bump with wide distribution and low intensity exists and no sharp diffraction characteristic peaks exist, which is different from that for a crystalline compound. The softening temperature of the glass frit per WO2012/129554 is in a range of 300° C. to 800° C. For another example, US Patent No. US2011/0232747 discloses an electrically conductive paste for a front electrode of a crystalline silicon solar cell, in which a Pb—Te—O-based glass frit is used, and the method for preparing the glass frit includes: mixing $TeO_2$, PbO and $Li_2CO_3$, heating the mixture to 900° C. to melt and keeping at 900° C. for one hour, and then quenching the molten mixture to obtain the Pb—Te—O-based glass frit. For another example, US Patent No. US2011/0232746 discloses an electrically conductive paste for a front electrode of a crystalline silicon solar cell, in which a Pb—Te—B—O-based glass frit is used, and a method for preparing the glass frit includes: heating a lead, tellurium and boron mixture to a temperature in a range of 800° C. to 1,200° C. to melt, and quenching the molten mixture to obtain the Pb—Te—B—O-based glass frit. The glass frit is an amorphous material and does not have a melting temperature.

The glass-free corrosion binder of the present invention is a crystalline compound, has a melting point, and is different from the glass frit. The glass-free corrosion binder of the present invention is one or a combination of two or more selected from the following Pb—Te—O based crystalline compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_6Te_5O_{18}.5H_2O$, $PbTe_2O_5$, $PbH_4TeO_6$, $PbTeCO_5$ and $Pb_3TeN_2O_8$, and these crystalline compounds have a melting temperature in a range of 440° C. to 760° C. The glass-free corrosion binder is crystalline compounds, has a typical crystal characteristics, and when being heated to the melting temperature, the crystal begins to melt into a liquid and has no softening temperature, and the melting point is related to the material composition.

The crystal glass-free corrosion binder is distinctly different from the conventional glass frit in terms of its internal atomic structure. Each particle in the prepared glass-free corrosion binder is a crystalline compound having ordered atomic structure while each glass frit particle is in an amorphous structure with a random atomic network. Significant difference can be shown by X-ray diffraction (XRD) measurement. XRD scan of a glass-free corrosion binder sample yields several sharp peaks at certain diffraction angles that are specifically associated with the corresponding crystalline compound. While XRD scan of a glass frit material shows a mostly flat distribution and only a small bump of low strength near the small diffraction angles region. Additionally, the structural difference between the crystalline glass-free corrosion binder and the glass frit can be directly revealed by transmission electron microscopy (TEM) image. When a TEM image of the crystalline compound of any one of the glass-free corrosion binder added into the conductive paste of the present invention is taken, it demonstrates a surface with ordered atomic arrangement. But TEM image of any glass frit exhibits a surface with disordered atomic arrangement.

Additional difference between crystalline glass-free corrosion binder and glass frit may resulted from their preparation methods, even though they may be started from substantially same oxide material with same or very similar compositions. Conventional glass frit is typically formed by first heating the oxide materials till melt followed by quenching the melt in certain processes, which are different with the methods of making the glass-free corrosion binders as described above.

The glass-free corrosion binder of the present invention is prepared by one of the following methods: liquid phase chemical reaction method, gas-phase chemical reaction method, melting controlled cooling method and vacuum melting controlled cooling method. The glass-free corrosion binder has a shape of one or a combination of two or more selected from sphere, sphere-like shape, sheet, particle and colloidal particle. The size of the glass-free corrosion binder of the present invention is not particularly limited, and in an embodiment, the size is less than 15 μm; in an embodiment, the size is less than 5 μm; in another embodiment, the size is less than 3 μm; in another embodiment, the size is in a range of 0.1 to 2.0 μm; in another embodiment, the size is in a range of 0.3 to 1.7 μm.

In an exemplary embodiment, the glass-free corrosion binder of the present invention may be prepared by using a chemical reaction method as: mixing a hot telluric acid solution (tellurous acid solution, tellurate solution or tellurite solution) and a lead acetate solution, where the molar ratio of Te to Pb in the solution is in a range of 0.1:10 to 10:0.1; stirring the mixed solution at a temperature in a range of 80° C. to 120° C. at a stirring speed in a range of 1,000 to 1,500 r/min for reaction for 2 to 5 hours, to generate a precipitate, and collecting a solid through solid-liquid separation and washing, till the pH value of the filtrated water is in a range of 5 to 7, and drying the solid at 150° C. for 2 to 3 hours, to obtain the Pb—Te based crystalline compound, which is then pulverized and ground, to obtain a Pb—Te based crystalline compound particle. As well known to persons of ordinary skill in the art, by changing the chemical reaction conditions in the exemplary embodiment, including changing the chemical components or the reaction temperature or time, Pb—Te based crystalline compounds with similar properties can be obtained. In another exemplary embodiment, the glass-free corrosion binder of the present invention may be prepared by using a gas-phase chemical reaction method, and the preparation process includes: continuously introducing $Pb_xTe_y$ alloy vapor into a reaction chamber filled with oxygen atmosphere; reacting at a temperature in a range of 1,000° C. to 1,400° C. for 1 to 4 hours, and naturally cooling the resulting product to 25° C. to obtain the Pb—Te based crystalline compound, which is then pulverized and ground, to obtain a Pb—Te based crystalline compound particle. As well known to persons of ordinary skill in the art, by changing the chemical reaction conditions in the exemplary embodiment, Pb—Te based crystalline compounds with similar properties can be obtained. In another exemplary embodiment, the glass-free corrosion binder of the present invention may be prepared by using a solid-phase reaction method, and the preparation process includes: in a non-reducing atmosphere (including oxygen atmosphere, air atmosphere, nitrogen atmosphere and argon gas atmosphere), heating a tellurium oxide and a lead oxide to a temperature in a range of 700° C. to 1,000° C., melting the tellurium oxide and the lead oxide for reaction, naturally cooling the resulting product to 25° C., and then pulverizing and grinding, to obtain a Pb—Te based crystalline compound particle. As well known to persons of ordinary skill in the art, by changing the chemical reaction conditions in the exemplary embodiment, Pb—Te based crystalline compounds with similar properties can be obtained. For example, a tellurium oxide and a lead oxide may be melted at a temperature of 700° C. or less or a temperature of 1,000° C. and more, a flowing protection gas (such as $N_2$, $CO_2$ and Ar) that is not heated flows through the surface of the molten to accelerate the cooling rate; or a protection gas (such as $N_2$, $CO_2$ and Ar) that is heated flow through the surface of the molten to decrease the cooling rate, to obtain a Pb—Te—O-based crystalline compound. In another exemplary embodiment, the glass-free corrosion binder of the present invention may be prepared by using a vacuum melting controlled cooling method, and the preparation process includes: in a vacuum atmosphere, melting a tellurium oxide and a lead oxide at a temperature in a range of 700° C. to 1,000° C., naturally cooling the resulting product to 25° C., and then pulverizing and grinding, to obtain a Pb—Te based crystalline compound particle. As well known to persons of ordinary skill in the art, by changing the chemical reaction conditions in the exemplary embodiment, Pb—Te—O based crystalline compounds with similar properties can be obtained. For example, a tellurium oxide and a lead oxide may be melted at a temperature of 700° C. or less or a temperature of 1,000° C. and more; a gas (such as $N_2$, $CO_2$ and Ar) may be used to flows through the surface of the molten to accelerate the cooling rate; or a hot gas (such as $N_2$, $CO_2$ and Ar) may be used to flow through the surface of the molten to decrease the cooling rate, to obtain a Pb—Te—O-based crystalline compound.

In one or more embodiments, the differences in structures and preparation methods between a Pb—Te—O based glass material and crystalline compounds are illustrated by following examples.

Figure 4:
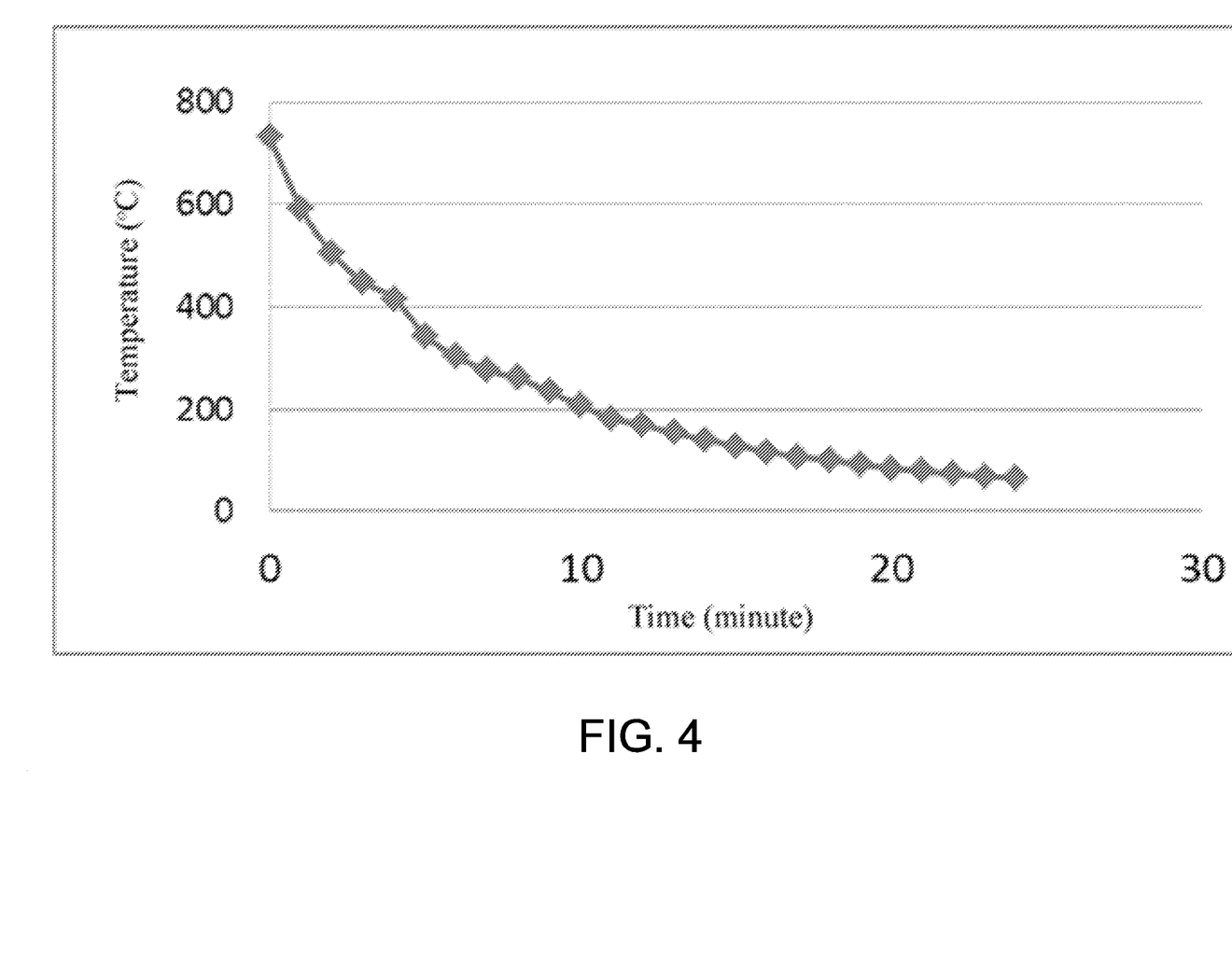
FIG. 4 shows a cooling curve in preparing a Pb—Te—O crystalline glass-free corrosion binder.
Figure 5:
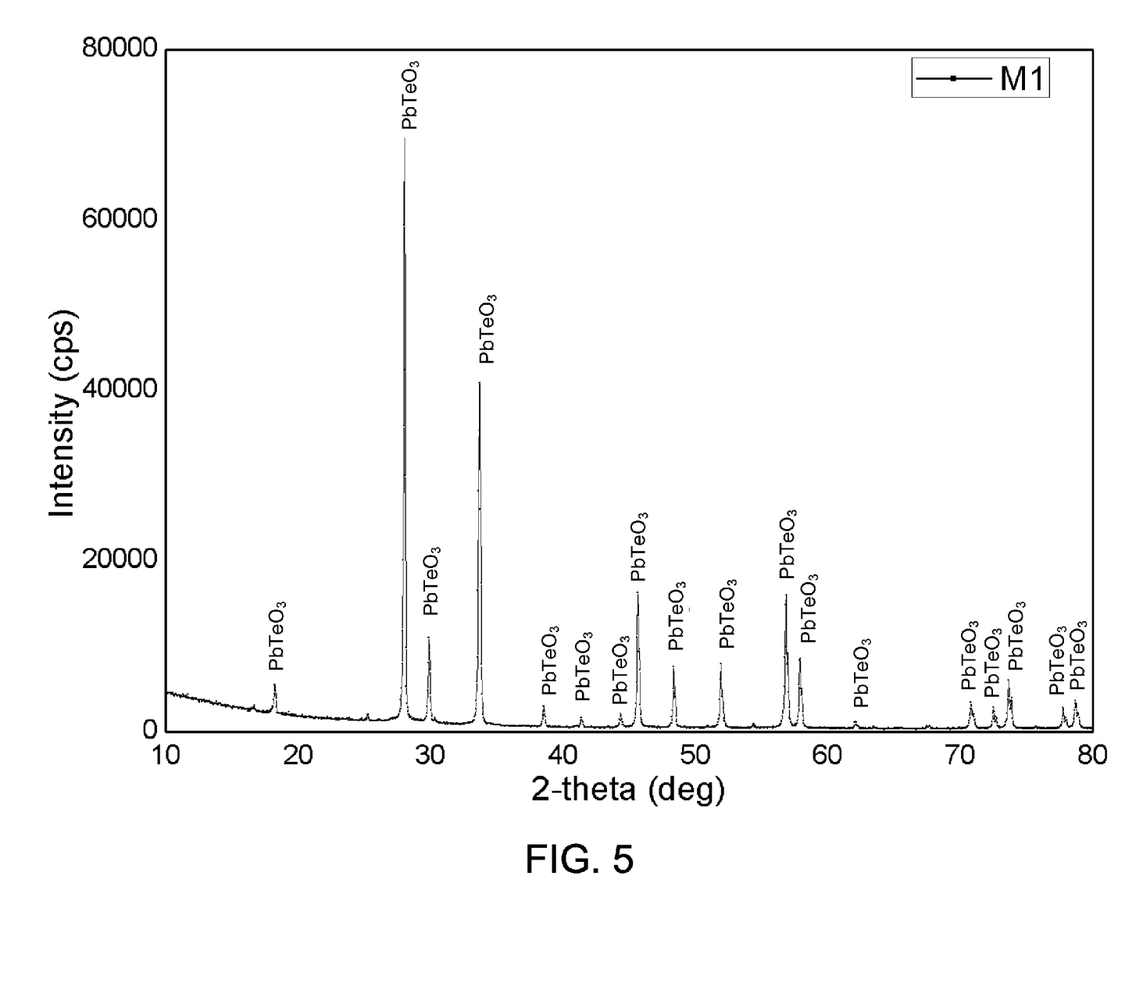
FIG. 5 is an exemplary diagram of XRD measured from a Pb—Te—O-based crystalline compound glass-free corrosion binder, in which sharp diffraction characteristic peaks exist in a small angle range.

In an example according to an embodiment of the present invention, chemical compound $TeO_2$ and PbO in powder forms are mixed with a mole ratio of 1:1. After mixing, the mixture is heated in air environment to about 900° C. (which is above the melting point of either chemical compound) and is further held at the temperature for about 30 minutes to form a molten mixture. Then the molten mixture is removed from furnace and cooled naturally in a room-temperature atmosphere to form a bulk material. Upon the removal from the furnace, the temperature of the molten mixture is first cooled from 900° C. in the furnace to 732° C. in about 3 seconds. FIG. 4 shows a plot of temperature drop after removal of the molten mixture from furnace versus its cooling time in a process for preparing the glass-free corrosion binder according to an embodiment of the present invention. As shown, the recording starts from 732° C. and the temperature drops to 593° C. in the first 1 minute. The average cooling rate is about 139° C./min. In a second minute, the temperature drops further to 504° C. with an average cooling rate of 89° C./min. In a third minute, the temperature drops to 449° C. with an average cooling rate of 55° C./min. Furthermore, in a fourth minute, it drops to 416.8° C. with an average cooling rate of 32.8° C./min. At this stage, the molten mixture has become a bulk material. The bulk material is crushed into small particles and further ball-milled into fine powders with substantially round shape having $D_{50}$ sizes ranging from 0.1 to 15 μm. Using XRD to exam samples of the fine powders, the resulted diffraction pattern (marked as M1) is shown in FIG. 5, plotted as the diffraction intensity versus 2θ (θ is X-ray incident angle) values across a range from 10 degrees to 80 degrees. As shown, the plot yields many sharp peaks at certain 2θ values corresponding to characteristic peaks specific for crystal compounds $PbTeO_3$, indicating that the glass-free corrosion binder in powered form obtained via above preparation method shows a substantially $PbTeO_3$ crystalline characteristic.

Figure 6:
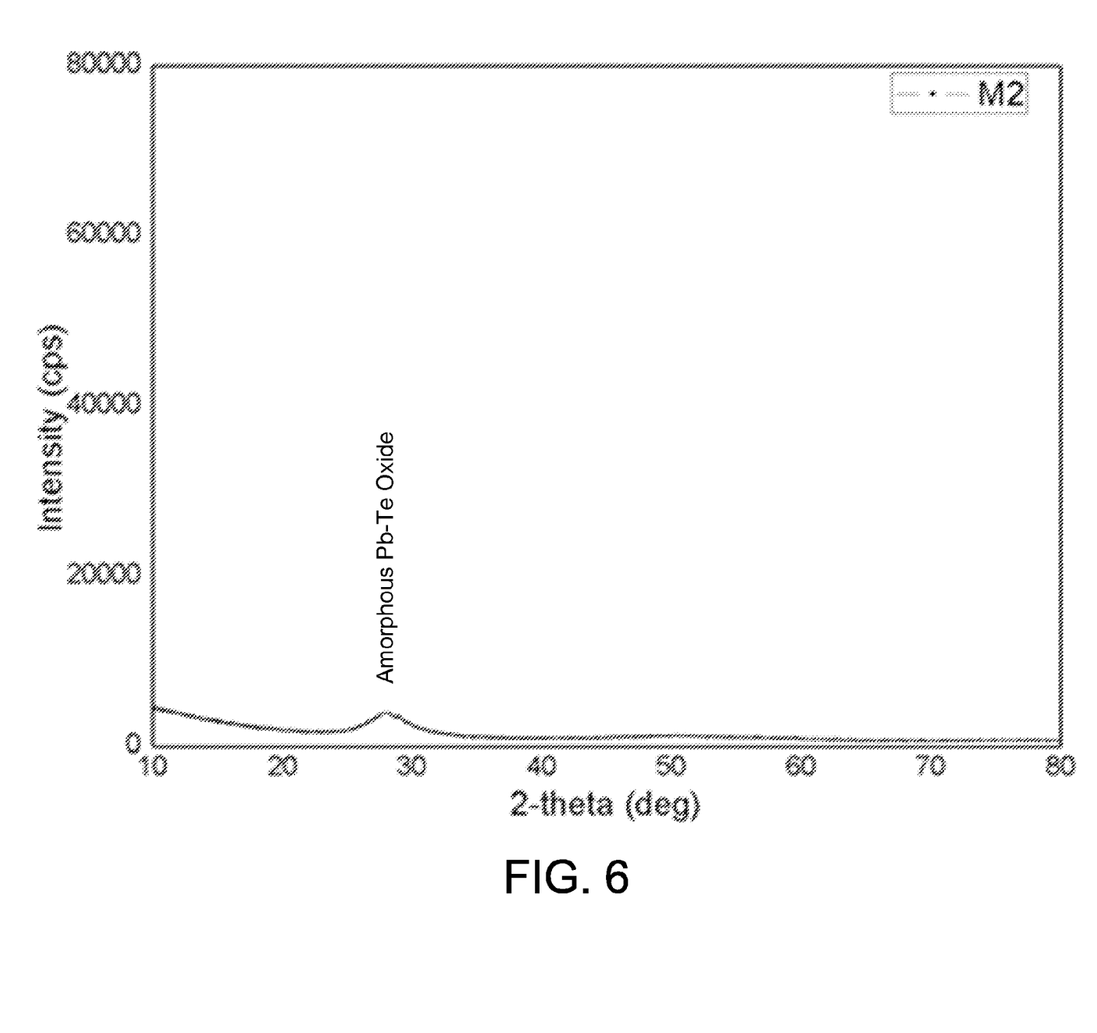
FIG. 6 is an exemplary diagram of XRD measured from a Pb—Te—O-based glass frit, in which a bump with a wide distribution and low intensity exists in a small angel range, and no sharp diffraction characteristic peaks exist.

In another example, same chemical compounds $TeO_2$ and PbO in powders were mixed with the same mole ratio of 1:1. The powder mixture was placed in a crucible and heated in air atmosphere to form a melt, and maintained at 900° C. for 30 min. Then the melt was cooled quickly by a quenching method. In an implementation, the melt was quenched by pouring the melt directly on a stainless steel platen to obtain a bulk platelet according to methods presented in U.S. patent Ser. No. 13/100,550 and other related references. In another implementation, the melt was quenched by pouring into deionized water to form a bulk material. The bulk platelet material was crunched by grinding into small particles which are further ball-milled into fine powders having $D_{50}$ sizes of 0.1~15 microns. Using XRD to exam samples of the fine powders, the resulted diffraction pattern (marked as M2) is shown in FIG. 6. As shown, the plotted diffraction intensity versus 2θ (θ is X-ray incident angle) values across a range from 10 degrees to 80 degrees yield a wide range of low intensity curve with only a small bump near the small angular regions. This is a clear indication that no crystalline structure exists in these fine powders, instead, the powders obtained by following conventional preparation method is predominantly glass material with an amorphous structure.

In the above-mentioned two examples, although the use of the same composition and proportion of $TeO_2$ and PbO oxide powders, different preparation method yields different material with different atomic structure and physical property. The material made using the method of the present invention shows glass-free Pb—Te—O-based crystalline particles while another method following prior art references yields only glass particles. Consequently, the obtained different particles have different physical property, which shows different performance during a sintering/firing process in associated with the application of the conductive paste. Specifically, for the electrically conductive paste with the above two different particles, as temperature increases during the sintering/firing process, the glass-free Pb—Te—O-based crystalline particles go through a direct physical phase transition from a solid phase to a liquid phase while the particles with glass structure particles in the same conductive paste go through a phase transition from a solid state to a glass-softening state and stay in the softening condition in a range of the temperature before finally transforming into a liquid state.

The electrolytic conductive paste of the present invention contains a glass-free corrosion binder which is a Pb—Te—O-based crystalline compound. During the process of sintering, the Pb—Te—O based crystalline compound glass-free corrosion binder changes liquid from solid when the temperature reaches the melting point. Before the melting point, the glass-free corrosion binder is a solid, and will not fill the pores in the metallic powder and hinder the discharge of the organic components, thereby solving the problem that the glass frit clogs the pores when being softened at the early stage; after being melted, the glass-free corrosion binder is in a liquid state and has a low viscosity, can rapidly flows to the bottom through voids among the metallic powder, and can effectively etch and penetrate the antireflective insulating layer on the front side of the crystalline silicon solar cell, so that a good ohmic contact is formed between the electrically conductive metallic powder and the crystalline silicon solar cell, and the electrically conductive metallic powder can be effectively wet, thereby promoting the combination of the metallic powder. As a result, a high-conductivity front electrode of a crystalline silicon solar cell is formed. Therefore, compared with the glass frit, the corrosion is faster and fuller, and the amount of the Pb—Te—O-based crystalline compound glass-free corrosion binder is less. Further, since the low-viscosity Pb—Te—O-based compound melt easily spreads, many interfaces are provided, so that electrically conductive contact points are increased, and the tunneling effect is improved, and the resistance is reduced. The inventors find in the study that, if the content of the glass-free corrosion binder in the electrically conductive paste for a front electrode of a crystalline silicon solar cell in the embodiments is greater than 12 parts by weight, the P—N junction region may be penetrated, resulting in a short circuit; if the content of the glass-free corrosion binder is less than 0.5 part by weight, the antireflective layer may be not removed completely, resulting in deterioration of the performance of the crystalline silicon solar cell. Therefore, the weight ratio of the glass-free corrosion binder in the electrically conductive paste for a front electrode of a solar cell is in a range of 0.5 wt % to 12 wt %.

II. Metallic Powder

The electrically conductive paste for a front electrode of a crystalline silicon solar cell of the present invention contains a metallic powder. In an embodiment, the metallic powder is a metallic powder uncoated with silver, including at least one selected from silver, gold, platinum, copper, iron, nickel, zinc, titanium, cobalt, aluminum, chromium, palladium and rhodium or an alloy thereof. In another embodiment, the metallic powder is any one or a combination of two or more selected from copper, iron, nickel, aluminum, zinc, titanium, cobalt, chromium and, manganese coated with silver, the thickness of the silver coating layer is in a range of 10 to 2,000 nm, and the size of the metallic powder coated with silver is in a range of 0.1 to 5.0 μm. In another embodiment, the metallic powder is a mixture of a metallic powder uncoated with silver and a metallic powder coated with silver, and the weight ratio of the metallic powder uncoated with silver to the metallic powder coated with silver is in a range of 5:95 to 95:5. Specifically, the metallic powder is used for exerting an electrically conductive effect in the embodiments of the present invention, and is a component for forming an electrode. In a preferred embodiment, the melting point of the metallic powder is preferably in a range of 350° C. to 2,000° C., further preferably in a range of 450° C. to 1,800° C., and more preferably in a range of 600° C. to 1,450° C. The inventors find in the study that, if the melting point of the metallic powder is lower than 350° C., during sintering, the metal particles will be melted excessively early, and hinder the discharge of the organic carrier, and flow during sintering, so that the aspect ratio of gate lines is reduced; if the melting point of the metallic powder is higher than 2,000° C., the metallic powder cannot be sintered effectively during the sintering process, too many voids exist in the electrically conductive metallic block, resulting in a high resistance of channels and deterioration of performance.

In a further preferred embodiment, the metallic powder is at least one selected from silver, gold, platinum, palladium and rhodium, or at least selected from silver, gold, platinum, palladium and rhodium doped with copper, iron, nickel, zinc, titanium, cobalt, aluminum, chromium and manganese, or an alloy thereof, such as manganese-copper alloy, constantan alloy and nickel-chromium alloy.

In yet a further preferred embodiment, the metallic powder is any one selected from copper, iron, nickel, aluminum, zinc, titanium, cobalt, chromium and manganese coated with silver, that is, any one metallic particle of copper, iron, nickel, aluminum, zinc, titanium, cobalt, chromium and manganese having a layer of silver continuously coated on the outer surface.

In an embodiment of a metallic powder having a silver coating structure, the thickness of the sliver coating layer is preferably in a range of 1 to 2,000 nm, and more preferably in a range of 2 to 1,000 nm. The inventors find in the study that, if the thickness of the Ag layer is less than 1 nm, the Ag content is excessively low, and the contact resistance or the drain current of the electrode is significantly increased; if the thickness of the Ag layer is greater than $10^4$ nm, the particle diameter of the electrically conductive metallic powder is excessively large, since Ag is noble metal, the cost of the metallic powder is increased, thereby increasing the cost of the crystalline silicon solar cell. Definitely, the silver layer of the metallic powder having a silver coating structure may be replaced by other noble metals such as gold and platinum. The metallic particle coated with silver may be an alloy of metals selected from copper, iron, nickel, aluminum, zinc, titanium, cobalt, chromium and manganese, such as manganese-copper alloy, constantan alloy and nickel-chromium alloy. The metallic powder coated with silver is formed by plating a layer of silver on a metallic powder of copper, iron, nickel, aluminum, zinc, titanium, cobalt, chromium or manganese. In an exemplary embodiment, one or more types of metallic powder of copper, iron, nickel, titanium, aluminum, cobalt, chromium, zinc or manganese having a particle diameter in a range of 0.1 to 5.0 µm or an alloy thereof are placed in a dilute weak acid and immersed for 10 to 300 s to remove the oxide layer on the surface of the metal, and then silver is plated on the metallic powder to a thickness of about 10 to 2,000 nm by using a chemical plating method. In an exemplary embodiment, the composition of the solution and the process conditions for chemical plating are: $AgNO_3$: 2.4 to 14.2 g/L, ammonia: 0.8 g/L, formaldehyde: 1 to 3 g/L, hydrazine hydrate: 1 to 4 g/L, a composite dispersant: 1.0 g/L, pH value: 11, bath temperature: 60° C., stirring speed: 1,000 r/min, drying: 50° C., 30 min. In another exemplary embodiment, one or more types of metallic powder of copper, iron, nickel, titanium, cobalt, aluminum, chromium, zinc or manganese having a particle diameter in a range of 0.1 to 5.0 µm or an alloy thereof are placed in a dilute weak acid and immersed for 10 to 300 s to remove the oxide layer on the surface of the metal. The metal powder is washed with deionized water to remove residual acid. The wet powder is dried in a vacuum oven, and then the dry metallic particles free of oxide layer are placed in a vacuum deposition device for vacuum deposition, to obtain the metallic powder coated with silver.

In the embodiments of the metallic powder, the size of the metallic powder particle is first required to meet requirements for printing, for example, not clogging the printing stencil. Therefore, preferably, the particle diameter of the metallic powder is distributed in a range of 0.1 to 5.0 µm, and if the particle diameter of the metallic powder is greater than 5 µm, problems of clogging the printing stencil and disconnection of the electrode easily occur; if the particle diameter of the metallic powder is less than 0.1 µm, the viscosity of the paste is greatly improved, resulting in failures in normal printing. In addition, the metallic powder having the preferred particle diameter can also reduce the area occupied by the electrode, thereby improving the light conversion efficiency of the solar cell, and at the same time, effectively reducing the thickness of the electrode, reducing the amount of materials and reducing the production cost.

III. Organic Carrier

The electrically conductive paste for a front electrode of a crystalline silicon solar cell of the present invention contains an organic carrier. The organic carrier includes an organic solvent, a binder, a wetting and dispersing agent, a thixotropic agent and other functional additives. The weight ratio of the organic carrier in the electrically conductive paste for an electrode is 5 to 25. Based on the total weight of 100 parts of the organic carrier, the organic solvent accounts for 50 to 95 parts by weight, the binder accounts for 1 to 40 parts by weight, the wetting and dispersing agent accounts for 0.1 to 10 parts by weight, and the thixotropic agent and other functional additives account for 1 to 20 parts by weight. In an exemplary embodiment, the organic solvent may be at least one with a medium or high boiling temperature, such as alcohol (such as terpineol, butyl carbitol), alcohol ester (such as alcohol ester-12), terpene and the like. The binder may be at least one selected from ethyl cellulose, polymethacrylate, alkyd resin, and the like. The wetting and dispersing agent is used to help dispersing inorganic powders in the organic carrier, and is not particularly limited. The thixotropic agent is used to increase the thixotropy of the paste in the printing process, so as to ensure the resolution of electrode pattern and better aspect ratio. The thixotropic agent may be an organic thixotropic agent selected from hydrogenated castor oil derivatives or polyamide wax. The other functional agents may be added as required, such as microcrystalline wax may be added for reducing the surface tension, DBP may be added for improving the flexibility of the paste, and PVB may be added for improving the adhesion.

IV. Preparation Method of the Electrically Conductive Paste

The present invention provides a method for preparing an electrically conductive paste for a front electrode of a solar cell by using a simple process with easy-controlled conditions and reduced production cost. The method includes, based on the total weight of 100 parts, weighing materials of the following formulation: 1) a metallic powder 70 to 95 parts; 2) an organic carrier 5 to 25 parts; and 3) a glass-free corrosion binder 0.5 to 12 parts. The glass-free corrosion binder is a Pb—Te—O based crystalline compound, having a melting temperature in a range of 440° C. to 760° C. Additionally, the method includes mixing and grinding the weighed glass-free corrosion binder, metallic powder and organic carrier, to obtain the electrically conductive paste for a front electrode of a solar cell.

Figure 7:
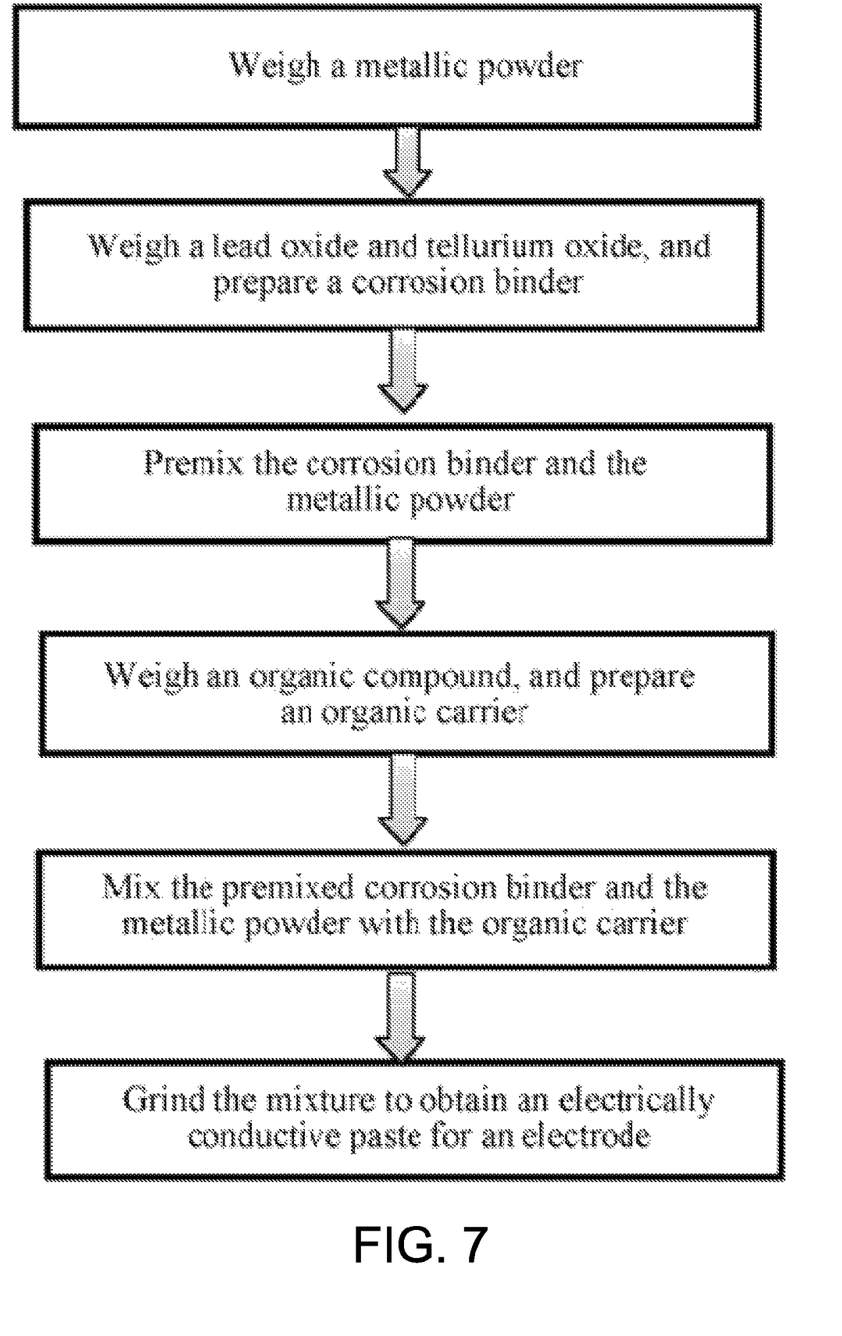
FIG. 7 is a schematic view of a process of preparing an electrically conductive paste of the present invention.

An exemplary preparation process of an electrically conductive paste for an electrode is shown in FIG. 7. First, a metallic powder including a metallic powder uncoated with silver and a metallic powder coated with silver is weighed; next, a lead oxide and a tellurium oxide are weighed, and a glass-free corrosion binder is prepared, where the method for preparing the glass-free corrosion binder is as described above; the glass-free corrosion binder and the metallic powder are premixed. Then, an organic compound is weighed, and an organic carrier is prepared. Finally, the premixed glass-free corrosion binder and metallic powder is mixed with the organic carrier, and the resulting mixture is ground to obtain the electrically conductive paste for an electrode. It should be noted that FIG. 7 only shows an example, which should not be used to limit the scope of the present invention.

Several exemplary embodiments of preparation of an electrically conductive paste for an electrode are described below. In an embodiment, first, a weighed glass-free corrosion binder and a weighed metallic powder are premixed, the mixture is mixed with a weighed organic carrier, and the resulting mixture is ground to obtain the electrically conductive paste for a front electrode of a crystalline silicon solar cell. In another embodiment, first, a weighed glass-free corrosion binder and a weighed organic carrier are premixed, a weighed metallic powder is added to the mixture for further mixing, and then the resulting mixture is ground to obtain the electrically conductive paste for a front electrode of a crystalline silicon solar cell. In another embodiment, first, a weighed metallic powder and a weighed organic carrier are premixed, a glass-free corrosion binder is added to the mixture, and then the resulting mixture is ground to obtain the electrically conductive paste for a front electrode of a crystalline silicon solar cell. In another embodiment, first, a weighed metallic powder and part of a weighed organic carrier are premixed, a glass-free corrosion binder and the rest weighed organic carrier are premixed, the tow premixed mixtures are mixed, and then the resulting mixture is ground to obtain the electrically conductive paste for a front electrode of a crystalline silicon solar cell.

The electrically conductive paste for a front electrode of a solar cell of the present invention contains a glass-free crystalline corrosion binder. The amount of the crystal-based glass-free corrosion binder as the functional additive in the conductive paste is controlled between 0.5 to 12 parts by weight, such as 1 part by weight, 4 parts by weight, 8 parts by weight and 10 parts by weight. Of course, there are many variations, alternatives, and modifications. For example, in a preferred embodiment, the glass-free corrosion binder is controlled within a range of 1 to 10 wt %. In another preferred embodiment, the glass-free corrosion binder is controlled within a range of 3 to 8 wt %. The glass-free corrosion binder of the present invention is one or a combination of two or more selected from the following Pb—Te—O based crystalline compounds: $PbTe_4O_9$, $PbTeO_3 \cdot 0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8 \cdot H_2O$, $Pb_4Te_{1.5}O_7$, $Pb_5TeO_7$, $Pb_6Te_5O_{18} \cdot 5H_2O$, $PbTe_2O_5$, $PbH_4TeO_6$, $PbTeCO_5$ and $Pb_3TeN_2O_8$, and these Pb—Te—O based crystalline compounds. Selection of the Pb—Te—O-based crystalline compound for the glass-free corrosion binder is partially based on that its melting temperature usually is around 500° C. or higher which is high enough to let substantially all organic carrier to release without being clogged in the paste structure (hence to degrade the sintering process). When several Pb—Te—O crystal compounds are mixed, the melting point of the mixture may be lower from the phase diagram analysis. In certain embodiments, the selected Pb—Te—O-based crystalline glass-free corrosion binder has a melting temperature in a preferred range of 440-760° C. as a functional additive in the conductive paste for manufacturing electrode on semiconductor device.

In any conductive paste for forming electrodes of semiconductor devices, metallic powder is one major component designated as electrical conductive medium of the electrode. In an embodiment, the metallic powder of the present invention is a metallic powder uncoated with silver, including at least one or a combination of two or more selected from silver, gold, platinum, copper, iron, nickel, zinc, titanium, cobalt, aluminum, chromium, manganese, palladium and rhodium. In another embodiment, the metallic powder of the present invention is one or a combination of two or more selected from copper, iron, nickel, aluminum, zinc, titanium, cobalt, chromium and manganese coated with silver, where the thickness of the silver coating layer is in a range of 2 to 2,000 nm. The size of the metallic powder coated with silver is in a range of 0.1-5.0 µm. In another embodiment, the metallic powder of the present invention is a mixture of a metallic powder uncoated with silver and a metallic powder coated with silver, and the weight ratio of the metallic powder uncoated with silver to the metallic powder coated with silver is in a range of 5:95 to 95:5.

In the electrically conductive paste for a front electrode of a solar cell of the present invention, a glass-free corrosion binder having a melting temperature in a range of 440° C. to 760° C. is used. During use, when the sintering temperature of the electrically conductive paste reaches the melting temperature of the glass-free corrosion binder, the glass-free corrosion binder is rapidly melted and converted from a solid state of crystal into a liquid state, and effectively corrodes and penetrates the antireflective insulating layer on the front side of the crystalline silicon solar cell, so that a good ohmic contact is formed between the electrically conductive metallic powder and the crystalline silicon solar cell, and the electrically conductive metallic powder is effectively wet, thereby promoting the combination of the metallic powder. As a result, a high-conductivity front electrode of a crystalline silicon solar cell is formed.

The electrically conductive paste for a front electrode of a crystalline silicon solar cell of the present invention contains a glass-free corrosion binder. During the process of sintering the electrically conductive paste, when the temperature reaches the melting point of the glass-free corrosion binder, the glass-free corrosion binder is converted from a solid state into a liquid state, rapidly deposits on the surface of the antireflective layer and reacts with the antireflective layer fully in a short period of time. Through the rapid conversion of the physical form of the glass-free corrosion binder from the solid state into the liquid state, the clogging problem caused by the glass frit in softening state is solved, and a space for discharging the organic carrier is solved. By means of this type of solid state-liquid state combination, not only the antireflective insulating layer on the front side of the crystalline silicon solar cell can be effectively corroded and penetrated, but also the organic carrier can be easily discharged, and at the same time, the metallic powder is effectively sintered to have a more compact structure, thereby improving the soldering strength and the bulk conductivity.

In order to make the technical problems to be solved, the technical solutions and the beneficial effects of the present invention more clear and comprehensive, the present invention is further described in detail below with reference to exemplary embodiments. It should be noted that the specific embodiment described herein are merely used for illustrate the present invention, but not intended to limit the present invention.

Embodiment 1

Based on the total weight of 100 parts, the electrically conductive paste for a front electrode of a solar cell contains: 8.3 parts of a glass-free corrosion binder, 81.7 parts of a metallic powder and 10 parts of an organic carrier. The glass-free corrosion binder is a $PbTeO_3$ compound; the metallic powder is a silver powder, and the organic carrier includes, based on the total weight of 100 parts, 70 parts of a terpineol organic solvent, 14 parts of an ethyl cellulose binder, 10 parts of a wetting and dispersing agent, 5.5 parts of a thixotropic agent and 0.5 part of microcrystalline wax. Preparation of the glass-free corrosion binder includes: preparing a hot tellurous acid solution having a concentration of 0.1 mol/L and heating to 90° C., adding a lead acetate solution having a concentration of 0.1 mol/L in proportion (the molar ratio of tellurous acid to lead acetate being 1:1), heating the mixture solution for reaction, to obtain a precipitate of the $PbTeO_3$ compound. The metallic powder is a silver powder, and has a particle size in a range of 1 to 3 μm. After weighing the glass-free corrosion binder, the metallic powder and the organic carrier according to the above formulation, the glass-free corrosion binder and the organic carrier were mixed uniformly, and then the metallic powder was added and mixed uniformly, and finally the mixture was ground to a particle diameter of less than 5 μm by using a three-roll mill, to obtain the electrically conductive paste for a front electrode of a crystalline silicon solar cell.

Embodiment 2

Based on the total weight of 100 parts, the electrically conductive paste for a front electrode of a solar cell contains: 7.3 parts of a glass-free corrosion binder, 81.7 parts of a metallic powder and 11 parts of an organic carrier. The glass-free corrosion binder is a $Pb_3TeO_5$ compound, the metallic powder is a silver-coated nickel powder, the organic carrier includes, based on the total weight of 100 parts, 50 parts of an alcohol ester-12 organic solvent, 40 parts of a polymethacrylate binder, 5 parts of a wetting and dispersing agent, 4 parts of a thixotropic agent and 1 part of DBP. Preparation of the glass-free corrosion binder includes: at a proportion of a molar ratio of PbO and $TeO_2$ being 3:1, continuously introducing $Pb_3Te$ alloy vapor into a reaction chamber filled with oxygen atmosphere of 1,300° C., and inducing a chemical reaction, to obtain a powder of a Pb—Te—O-based crystalline compound deposited at the bottom of the chamber, and collecting a $Pb_3TeO_5$ compound. The metallic powder is prepared by using a chemical plating method, including: plating silver on a nickel powder to about 200 nm, where the particle size of the nickel powder is in a range of 0.5 to 3 μm. After weighing the glass-free corrosion binder, the metallic powder and the organic carrier according to the above formulation, the metallic powder and the organic carrier were mixed uniformly, and then the glass-free corrosion binder was added and mixed uniformly, and finally the mixture was ground to a particle diameter of less than 5 μm by using a three-roll mill, to obtain the electrically conductive paste for a front electrode of a crystalline silicon solar cell.

Embodiment 3

Based on the total weight of 100 parts, the electrically conductive paste for a front electrode of a solar cell contains: 8.8 parts of a glass-free corrosion binder, 80 parts of a metallic powder and 11.2 parts of an organic carrier. The glass-free corrosion binder is a $PbTeCO_5$ compound, the metallic powder is silver-coated copper, and the organic carrier includes, based on the total weight of 100 parts, 65 parts of a terpineol organic solvent, 20 parts of an alkyd resin binder, 0.1 part of a wetting and dispersing agent, 2.5 parts of a thixotropic agent1 and 2.4 parts of PVB. Preparation of the glass-free corrosion binder includes: in $CO_2$ atmosphere, placing PbO and $TeO_2$ at a proportion of a molar ratio of being 1:1 in a high-temperature (1,200° C.) furnace, and reacting for 1 hour, naturally cooling the resulting product, and pulverizing and grinding, to obtain the $PbTeCO_5$ compound. The metallic powder is a silver-coated copper powder, and is prepared by using a chemical plating method, including: plating silver on a copper powder to about 200 nm, where the particle size of the copper powder is in a range of 0.5 to 3 μm. After weighing the glass-free corrosion binder, the metallic powder and the organic carrier according to the above formulation, the metallic powder and the glass-free corrosion binder were mixed uniformly, and then the organic carrier was added and mixed uniformly, and finally the mixture was ground to a particle diameter of less than 5 μm by using a three-roll mill, to obtain the electrically conductive paste for a front electrode of a crystalline silicon solar cell.

Embodiment 4

Based on the total weight of 100 parts, the electrically conductive paste for a front electrode of a solar cell contains: 3.4 parts of a glass-free corrosion binder, 86.6 parts of a metallic powder and 10 parts of an organic carrier. The glass-free corrosion binder is a $PbTeO_3$ compound, the metallic powder is a titanium powder, and the organic carrier includes, based on the total weight of 100 parts, 60 parts of a butyl carbitol organic solvent, 15 parts of an ethyl cellulose binder, 5 parts of a wetting and dispersing agent, 15 parts of a thixotropic agent and 5 parts of PVB. Preparation of the glass-free corrosion binder includes: placing PbO and $TeO_2$ at a molar ratio of 1:1 in a high-temperature (500° C. to 900° C.) furnace, and reacting for 1 hour, naturally cooling the resulting product, and pulverizing and grinding, to obtain the $PbTeO_3$ compound. The metallic powder is a titanium powder having a particle size in a range of 0.5 to 10 μm. After weighing the glass-free corrosion binder, the metallic powder and the organic carrier according to the above formulation, the metallic powder and the glass-free corrosion binder were added into the organic carrier, and mixed uniformly, and then the mixture is ground to a particle diameter of less than 5 μm by using a three-roll mill, to obtain the electrically conductive paste for a front electrode of a crystalline silicon solar cell.

Embodiment 5

Based on the total weight of 100 parts, the electrically conductive paste for a front electrode of a solar cell contains: 9.8 parts of a glass-free corrosion binder, 72 parts of a metallic powder and 18.2 parts of an organic carrier. The glass-free corrosion binder is a $PbTeN_2O_8$ compound, the metallic powder is a cobalt powder, and the organic carrier includes, based on the total weight of 100 parts, 70 parts of an alcohol ester-12 organic solvent, 15 parts of an ethyl cellulose binder, 2 parts of a wetting and dispersing agent, 8 parts of a thixotropic agent and 5 parts of PVB. Preparation of the glass-free corrosion binder includes: placing PbO and $TeO_2$ at a molar ratio of 1:1 in a high-temperature reactor in $NO_2$ atmosphere and melting the mixture at 950° C. for 1 hour, and then naturally cooling the resulting product, and pulverizing and grinding, to obtain the $PbTeN_2O_8$ compound. The metallic powder is a cobalt powder, and has a particle size in a range of 0.5 to 3 μm. After weighing the glass-free corrosion binder, the metallic powder and the organic carrier according to the above formulation, the metallic powder and the glass-free corrosion binder were added into the organic carrier, and mixed uniformly, and then the mixture was ground to a particle diameter of less

Embodiment 6

Based on the total weight of 100 parts, the electrically conductive paste for a front electrode of a solar cell contains: 8.9 parts of a glass-free corrosion binder, 85.6 parts of a metallic powder and 5.5 parts of an organic carrier. The glass-free corrosion binder is a $Pb_2Te_3O_8$ compound, the metallic powder is platinum, and the organic carrier includes, based on the total weight of 100 parts, 95 parts of an alcohol ester-12 organic solvent, 1 part of an ethyl cellulose binder, 3 parts of a wetting and dispersing agent and 1 part of a thixotropic agent. Preparation of the glass-free corrosion binder includes: placing PbO and $TeO_2$ at a molar ratio of 2:3 in a vacuum high-temperature reactor and melting the mixture at 900° C. for 1 hour, and then naturally cooling the resulting product, and pulverizing and grinding, to obtain the $Pb_2Te_3O_8$ compound. The metallic powder is prepared by plating silver on an aluminum powder to about 200 nm through a chemical plating method, where the particle size of the aluminum powder is in a range of 0.5 to 3 After weighing the glass-free corrosion binder, the metallic powder and the organic carrier according to the above formulation, the metallic powder and the glass-free corrosion binder were added into the organic carrier, and mixed uniformly, and then the mixture was ground to a particle diameter of less than 5 μm by using a three-roll mill, to obtain the electrically conductive paste for a front electrode of a crystalline silicon solar cell.

Embodiment 7

Based on the total weight of 100 parts, the electrically conductive paste for a front electrode of a crystalline silicon solar cell contains: 5 parts of a glass-free corrosion binder, 80 parts of a metallic powder and 15 parts of an organic carrier. The glass-free corrosion binder is a $PbTeO_3$ compound, the metallic powder is silver-coated chromium, and the organic carrier includes, based on the total weight of 100 parts, 70 parts of an alcohol ester-12 organic solvent, 15 parts of an ethyl cellulose binder, 2 parts of a wetting and dispersing agent, 10 parts of a thixotropic agent and 3 parts of PVB. Preparation of the glass-free corrosion binder includes: placing PbO and $TeO_2$ at a molar ratio of 1:1 in a vacuum high-temperature reactor and melting the mixture at 900° C. for 1 hour, and then naturally cooling the resulting product, and pulverizing and grinding, to obtain the PbTeO3. The metallic powder is prepared by plating silver on a chromium powder to about 200 nm through a chemical plating method, where the particle size of the chromium powder is in a range of 0.5 to 3 μm. After weighing the glass-free corrosion binder, the metallic powder and the organic carrier according to the above formulation, the metallic powder and the glass-free corrosion binder were added into the organic carrier, and mixed uniformly, and then the mixture was ground to a particle diameter of less than 5 μm by using a three-roll mill, to obtain the electrically conductive paste for a front electrode of a crystalline silicon solar cell.

The above descriptions are merely preferred embodiments of the present invention, and are not used to limit the present invention. Any modifications, equivalent substitutions and improvements made without departing from the spirit and principle of the present invention shall fall within the protection scope of the present invention.

What is claimed is:

1. A method for manufacturing a front electrode of a semiconductor device, the method comprising:
    providing a semiconductor device including an insulation surface coating;
    printing an electrically conductive paste overlying a patterned contact region of the insulation surface coating, the electrically conductive paste comprising:
        a metallic powder with a weight composition ranging from 70 to 95 wt % based on a given total weight of the electrically conductive paste;
        a glass-free corrosion binder made from a plurality of Pb—Te—O-based crystalline particles with a weight composition ranging from 0.5 to 12 wt % based on the given total weight;
        an organic carrier with a weight composition ranging from 4.5 to 25 wt % based on the given total weight;
        wherein the glass-free corrosion binder is one or a combination of two or more Pb—Te—O based crystalline compounds, having a fixed melting temperature;
    sintering the electrically conductive paste overlying the patterned contact region of the insulation surface coating, wherein the sintering comprises:
        drying the electrically conductive paste at a first temperature range from 180° C. to 260° C. for 30 s up to 70 s;
        heating up to a second temperature range from 720° C. to 950° C. for 20 s up to 50 s; and
        cooling back to 25° C. to form an electrode;
    wherein the drying and heating from the first temperature range to the second temperature range are associated with releasing of the organic carrier, melting of the glass-free corrosion binder at the fixed melting temperature after the releasing of the organic carrier, and forming of a metallic bulk from the metallic powder wet by molten glass-free corrosion binder;
    wherein the molten glass-free corrosion binder induces etch-removing of the insulation surface coating at the patterned contact region to form an ohmic contact between the metallic bulk and the crystalline silicon solar cell.

2. The method of claim 1 wherein the glass-free corrosion binder comprises one or a combination of two or more selected from the following Pb—Te—O based crystalline compounds: $PbTe_4O_9$, $PbTeO_3.0.33H_2O$, $PbTeO_3$, $PbTeO_4$, $PbTe_3O_7$, $PbTe_5O_{11}$, $Pb_2TeO_4$, $Pb_2Te_3O_7$, $Pb_2Te_3O_8$, $Pb_3TeO_5$, $Pb_3TeO_6$, $Pb_3Te_2O_8.H_2O$, $Pb_4Te_{1.5}O_7$, $Pb_5TeO_7$, $Pb_5TeO_7$, $Pb_6Te_5O_{18}.5H_2O$, $PbTe_2O_5$, $PbH_4TeO_6$ $PbTeCO_5$ and $Pb_3TeN_2O_8$, having the fixed melting temperature selected from a range from 440° C. to 760° C. depending on said combination.

3. The method of claim 1 wherein the metallic powder comprises one or more metals selected from silver, gold, platinum, copper, iron, nickel, zinc, titanium, cobalt, aluminum, chromium, manganese, palladium and rhodium.

4. The method of claim 1 wherein the metallic powder comprises a plurality of particles made from one or more metals selected from copper, iron, nickel, zinc, titanium, cobalt, chromium, aluminum and manganese and respectively coated with silver.

5. The method of claim 1 wherein the metallic powder is a mixture of a first powder without silver coating and a second powder with silver coating; wherein the first powder without silver coating comprises a first plurality of particles made from one or more metals selected from silver, gold, platinum, copper, iron, nickel, zinc, titanium, cobalt, chromium, manganese, palladium and rhodium, and the second powder with silver coating comprises a second plurality of particles made from one or more metals selected from copper, iron, nickel, zinc, titanium, cobalt, chromium, aluminum and manganese with each particle being coated with a silver layer ranging from 10 nm to 2,000 nm; wherein a weight ratio of the first powder without silver coating to the second powder with silver coating is in a range of 5:95 to 95:5.

6. The method of claim 1 wherein the metallic powder comprises a plurality of particles having particle ranging from 0.1 μm to 5.0 μm.

* * * * *